United States Patent
Suzuki

(10) Patent No.: US 6,838,892 B2
(45) Date of Patent: Jan. 4, 2005

(54) PROBE CARD CARRIER AND METHOD OF CARRYING PROBE CARD

(75) Inventor: Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/380,966

(22) PCT Filed: May 29, 2002

(86) PCT No.: PCT/JP02/05216

§ 371 (c)(1),
(2), (4) Date: Mar. 21, 2003

(87) PCT Pub. No.: WO03/015154

PCT Pub. Date: Feb. 20, 2003

(65) Prior Publication Data

US 2003/0178987 A1 Sep. 25, 2003

(30) Foreign Application Priority Data

Aug. 7, 2001 (JP) .......................... 2001-239742

(51) Int. Cl.⁷ .......................... G01R 31/02; G01R 31/26
(52) U.S. Cl. ......................................... 324/754; 324/765
(58) Field of Search ........................... 324/754–755, 324/758, 765, 158.1

(56) References Cited

U.S. PATENT DOCUMENTS

| 4,864,227 | A | * | 9/1989 | Sato | 324/758 |
|---|---|---|---|---|---|
| 5,148,103 | A | * | 9/1992 | Pasiecznik, Jr. | 324/758 |
| 5,254,939 | A | * | 10/1993 | Anderson et al. | 324/754 |
| 5,444,386 | A | * | 8/1995 | Mizumura | 324/754 |
| 6,072,325 | A | * | 6/2000 | Sano | 324/760 |
| 6,107,813 | A | * | 8/2000 | Sinsheimer et al. | 324/758 |
| 6,414,478 | B1 | * | 7/2002 | Suzuki | 324/158.1 |
| 6,762,616 | B2 | * | 7/2004 | Kawaguchi et al. | 324/760 |

FOREIGN PATENT DOCUMENTS

| JP | 62-169341 | | 7/1987 | |
| JP | 02-001141 | | 1/1990 | |
| JP | 5-136219 | | 6/1993 | |
| JP | 05-136222 | | 6/1993 | |
| JP | 05136223 | A | * 6/1993 | ........... H01L/21/66 |
| JP | 5-175290 | | 7/1993 | |

* cited by examiner

Primary Examiner—Luan Thai
Assistant Examiner—Jarmele Hollington
(74) Attorney, Agent, or Firm—Oblon, Spivak, McClelland, Maier & Neustadt, P.C.

(57) ABSTRACT

A probe card conveyor 10 comprises a probe card conveyor 10, a body 12 provided with the probe card conveyor 10, and coupling mechanisms 13 provided in a plurality of positions on that side of the body 12 which is opposed to the probe device 20 and coupled individually to four coupled fittings 22 of the probe device 20. Further, the probe card conveyor 10 comprises a probe card mounting mechanism 17 for transferring a probe card 21 in the Y-direction and a lift mechanism 18 for raising and lowering the probe card mounting mechanism 17.

12 Claims, 8 Drawing Sheets

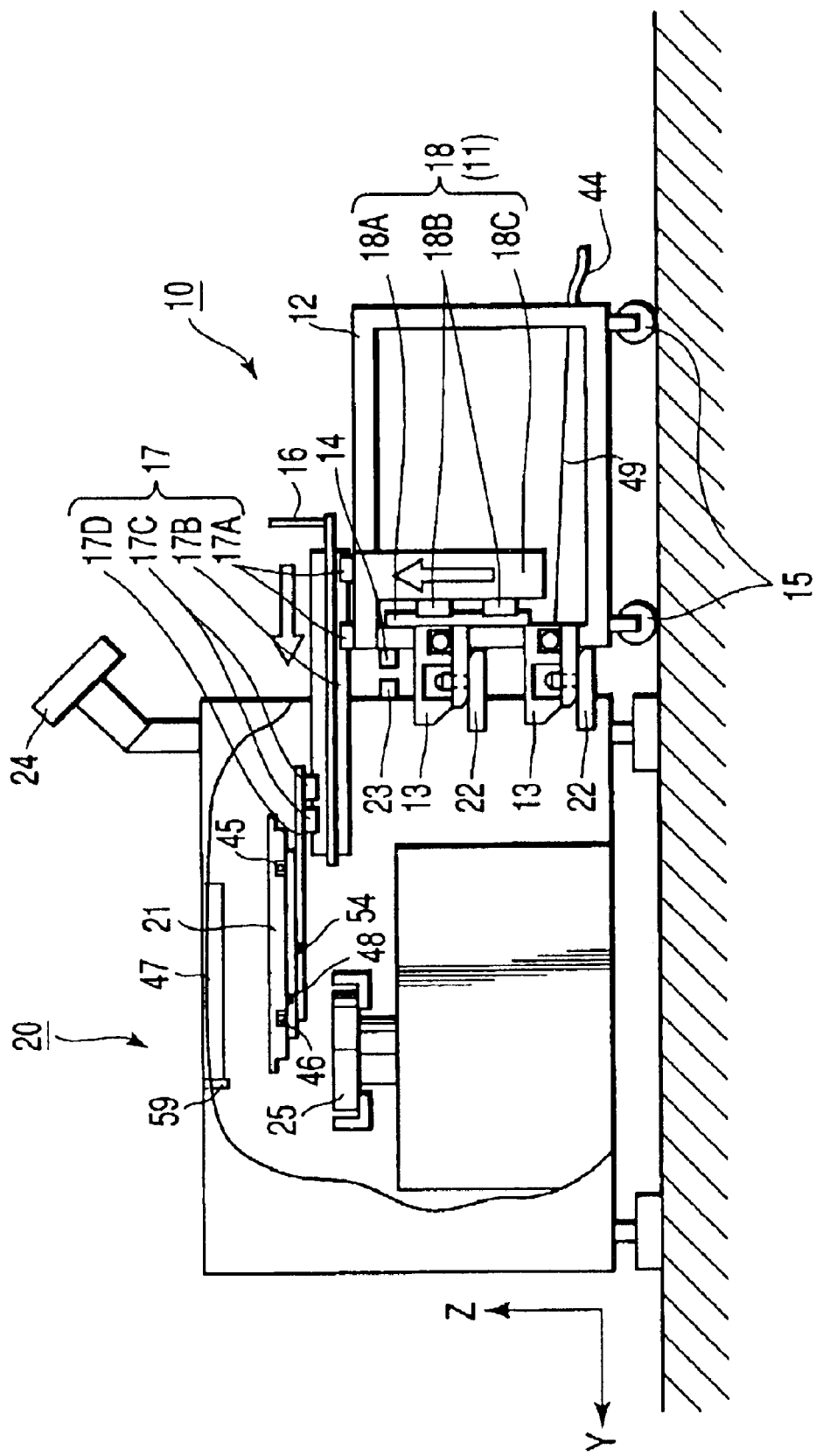
F I G. 8

PROBE CARD CARRIER AND METHOD OF CARRYING PROBE CARD

This application is based upon and claims the benefit of priority from the prior Japanese Patent Application No. 2001-239742, filed Aug. 7, 2001, the entire contents of which are incorporated herein by reference.

TECHNICAL FIELD

The present invention relates to a probe card conveyor and a probe card conveying method. More specifically, the invention relates to a probe card conveyor and a probe card conveying method capable of reducing the footprint (installation area) of a probe device. From another standpoint, moreover, the present invention relates to a probe card conveyor and a probe card conveying method capable of improving the safety of conveying operation for large-sized probe cards.

BACKGROUND ART

A probe device is a device that is used to examine the electrical properties of an object-to-be-inspected (e.g., integrated circuit formed on a wafer, hereinafter referred to as "wafer"). Usually, the probe device comprises a main chuck, that can move in X-, Y-, Z-, and θ-directions, and a probe card located over the main chuck. In inspecting the object, the main chuck carrying the wafer thereon is moved in the X- and Y-directions to align the wafer and the probe card with each other. Thereafter, the main chuck is raised in the Z-direction, whereupon the object-to-be-inspected is checked for electrical properties in a manner such that the object is in contact with a probe of the probe card. The probe card is detachably supported by means of a clamp mechanism that is located in the probe device.

The conventional probe device has a replacing device for the probe card. In attaching the probe card to the conventional probe device, one side (e.g., front cover) of the probe device is opened. The probe card replacing device is drawn out of the front face of the probe device. The probe card is set on the probe card replacing device. As the probe card replacing device and the clamp mechanism are operated, the probe card placed on the probe card replacing device is transferred to the clamp mechanism and held by means of the same mechanism. After the probe card is transferred to the clamp mechanism, the probe card replacing device is put into the probe device, and the probe device is covered.

In removing the probe card held by means of the clamp mechanism, the aforesaid processes are carried out in reverse order. In order to convey the probe card to the probe device, an operator takes out the probe card from a storage section (e.g., storage rack) or the like. The operator carries the probe card from the storage section to the probe device and sets it in the probe card replacing device. Further, the operator carries the probe card from the probe card replacing device to the storage rack and stores it therein.

DISCLOSURE OF INVENTION

The frequency of replacement of probe cards is relatively low. For example, the probe cards are replaced twice a day or thereabouts at the most. Thus, a problem was grasped that the operating efficiency of the probe card replacing device is low.

As objects-to-be-inspected such as wafers has have become large-sized and highly integrated, probe cards have been increased in size and weight. To cope with the increase of the size and weight of the probe card, the probe card replacing device is also increased in size, thus the probe card replacing device occupies a wider space in the probe device. Thus, a problem was also grasped that the footprint of the probe device in a clean room is larger and the equipment cost is higher.

A problem was also grasped that a probe card is large-sized and as heavy as 20 kg, making it hard for an operator to carry the probe card about.

The present invention was intended to solve the aforesaid problems. The object of the present invention is to provide a probe card conveyor and a probe card conveying method capable of conveying a probe card. Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

Based on an aspect of the present invention, there is provided a probe card conveyor, which comprises: a body movable with respect to a probe device; a plurality of coupling mechanisms provided on that side face of the body which is opposed to the probe device (the coupling mechanisms being coupled individually to coupled fittings on the probe device); a probe card mounting mechanism attached to the body (the probe card mounting mechanism being movable in the horizontal direction with the probe card mounted thereon); and a lift mechanism attached to the body and used to raise and lower the probe card mounting mechanism.

Preferably, the probe card mounting mechanism includes an arm for carrying the probe card thereon and transferring the probe card from the body to a main chuck located in the probe device 20.

Preferably, the coupling mechanism includes an engaging piece capable of engaging the coupled fitting to be aligned with the coupled fitting and a coupler to be coupled to the coupled fitting.

Preferably, the probe card conveyor further comprises a master jig for adjusting previously adjusting the respective positions of the coupling mechanisms.

Preferably, the coupling mechanisms are located in at least three positions on the side face of the body.

Preferably, the coupling mechanisms are attached to the side face of the body by means of a finely movable structure.

Preferably, the body includes means for disconnecting the coupler and the coupled fitting.

Preferably, the probe card conveyor further comprises a sensor for determining whether or not the probe card is placed on the probe card mounting mechanism.

Preferably, the lift mechanism 18 includes a Z-direction ball screw 49 and a motor for rotating the ball screw.

Based on another aspect of the present invention, there is provided a probe card conveying method, which comprises: coupling a probe card conveyor including a probe card mounting mechanism to a probe device; inserting the probe card mounting mechanism into a predetermined position in the probe device; raising the probe card mounting mechanism toward a clamp mechanism set in the upper part of the probe device; attaching and detaching the probe card between the clamp mechanism and the probe card mounting mechanism; lowering the probe card mounting mechanism to the predetermined position; returning the probe card mounting mechanism to the probe card conveyor; and disconnecting the probe card conveyor and the probe device from each other.

Preferably, in this probe card conveying method, the respective positions of coupling mechanisms set on the probe card conveyor are adjusted by means of a master jig before the probe card conveyor is coupled to the probe device.

BRIEF DESCRIPTION OF DRAWINGS

FIGS. 1A and 1B are views showing one embodiment of a probe card conveyor of the present invention, in which FIG. 1A illustrates an operating state immediately before the probe card conveyor and a probe device are coupled to each other, and FIG. 1B illustrates an operating state such that a probe card conveyor mechanism of the probe card conveyor is inserted in the probe device;

FIGS. 3A and 3B are views illustrating position adjustment for a coupled fitting of the probe device by the use of the probe card conveyor shown in FIGS. 1A and 1B, in which FIG. 3A is a plan view, and FIG. 3B is a side view;

FIGS. 4A and 4B are views showing a state immediately before the coupling mechanism of the probe card conveyor is coupled to the coupled fitting of the probe device after the position of the coupled fitting is adjusted by means of the coupling mechanism, in which FIG. 4A is a plan view, and FIG. 4B is a side view;

FIGS. 5A and 5B are views showing a state such that the coupled fitting of the probe device and the coupling mechanism of the probe card conveyor are coupled to each other, in which FIG. 5A is a plan view, and FIG. 5B is a side view;

FIGS. 6A and 6B illustrate an operating state in which the mounting position of the coupled fitting of the probe device is adjusted by means of the coupling mechanism of the probe card conveyor, in which FIG. 6A is a plan view, and FIG. 6B is a side view;

FIG. 8 is a view illustrating further in detail an operating state such that the probe card conveyor mechanism of the probe card conveyor shown in FIGS. 1A and 1B is inserted in the probe device;

FIGS. 10A and 10B are views illustrating further in detail the construction of the coupling mechanism of the probe card conveyor shown in FIGS. 1A and 1B, in which FIG. 10A is a plan view, and FIG. 10B is a side view.

BEST MODE FOR CARRYING OUT OF THE INVENTION

The accompanying drawings, which are incorporated in and constitute a part of the specification, illustrate presently preferred embodiments of the invention, and together with the general description given above and the detailed description of the preferred embodiments given below, serve to explain the principles of the invention.

The present invention will be described on the basis of the embodiments shown in FIGS. 1A to 6B.

Figure 1A:
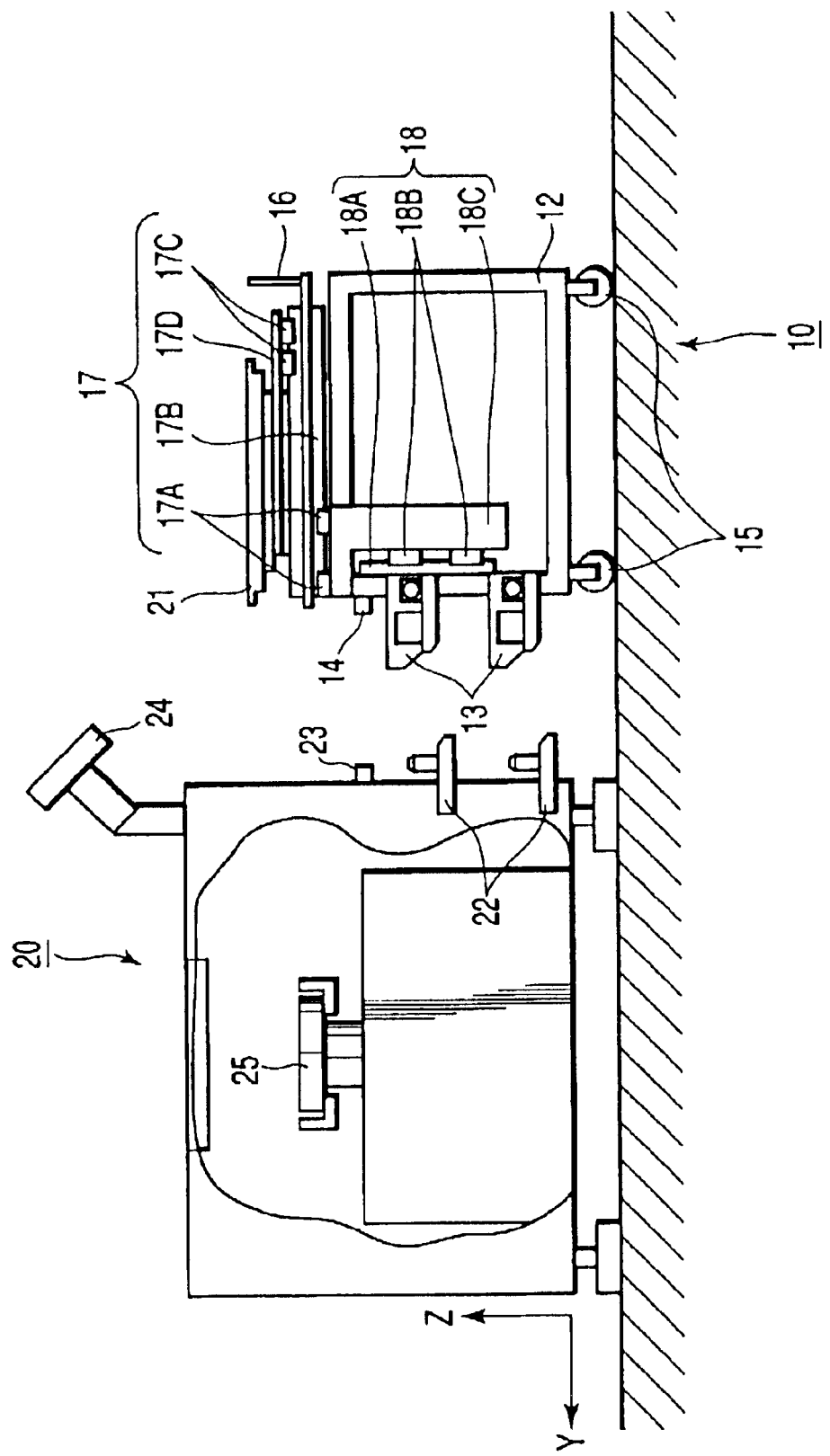
Figure 1B:
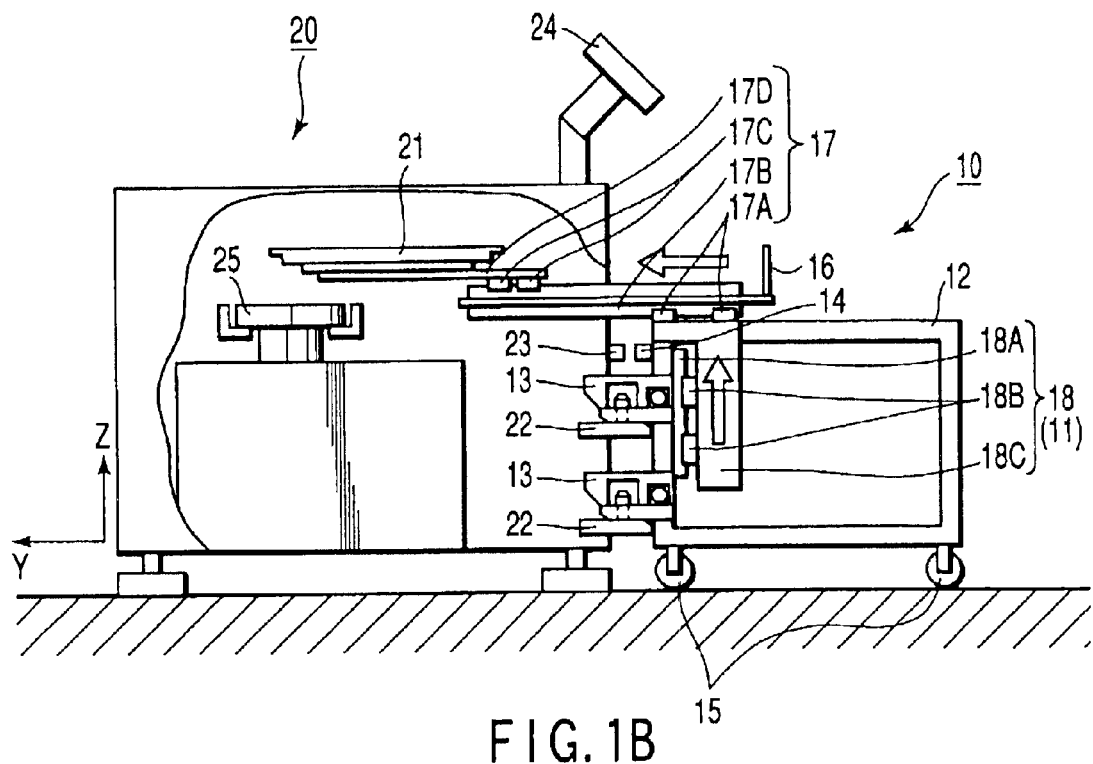

FIGS. 1A and 1B show a probe card conveyor 10 according to one embodiment of the present invention. The probe card conveyor 10 conveys a probe card 21 (e.g., outside diameter: 600 mm, weight: 20 kg) to a probe device 20. The probe card conveyor 10 comprises a body 12, a plurality of coupling mechanisms 13 provided on that side of the body which is opposed to the probe device, and a battery (not shown) for driving the probe card conveyor 10. The coupling mechanisms 13 may be four in number, for example, and preferably, should be three. The probe card conveyor 10 conveys the probe card 21 placed on it to the probe device 20. As shown in the same drawings, the four coupling mechanisms 13 are coupled individually to four coupled fittings 22 on the front face of the probe device 20 when the probe card 21 is conveyed. As a result of this coupling, the probe card conveyor 10 and the probe device 20 are coupled integrally to each other. The probe card conveyor 10 and the probe device 20 are provided with communication means (e.g., infrared communication means) 14 and 23, respectively, in positions where they face each other. The probe card conveyor 10 and a clamp mechanism 47 (see FIG. 7) in the probe device 20 are driven in response to instructions transmitted by this infrared communication.

As shown in FIGS. 1A and 1B, the probe card conveyor 10 may comprise casters 15 and a handle 16. The casters 15 are attached to the four corners of the bottom of the body 12. The handle 16 is secured to the upper-rear edge of the body 12. In replacing the probe card 21, an operator places the probe card 21 from a probe card storage section 51 (see FIG. 7) on the probe card conveyor 10. Thereafter, the operator holds the handle 16 and moves the probe card conveyor 10 to the probe device 20 as a target. In consequence, the operator need not carry about the probe card 21 that is large-sized and heavy in weight, which is not the case with the conventional system. Further, the handle 16 can serve also as a handle for operating the probe card conveyor 10, which will be described later.

As shown in FIGS. 1A and 1B, the probe card conveyor 10 may comprise a probe card mounting mechanism 17 and a lift mechanism 18. The probe card mounting mechanism 17 is provided with an arm 17D and a guide rail 17B. The probe card 21 is placed on the arm 17D. The guide rail 17B can move together with the arm 17D in a Y-direction (from side to side in the same drawings) on the body 12. Further, the arm 17D can move in the Y-direction on the guide rail 17B. Further, the arm 17D can move in two step in the Y-direction on the body 12. The lift mechanism 18 can raise and lower the probe card mounting mechanism 17 in the vertical direction (Z-direction).

As shown in FIGS. 1A and 1B, the probe card mounting mechanism 17 may be provided with left- and right-hand guide members 17A, a pair of guide rails 17B, left and right, in engagement for Y-direction movement along the guide members 17A, the arm 17D in engagement for movement in the Y-direction along the left- and right-hand guide rails 17B, a Y-direction ball screw coupled to the arm 17D by means of a nut member, a motor for driving the Y-direction ball screw, and a switch (not shown) for operating the motor. Engaging members 17C can be fixed in front and in rear on the left- and right-hand sides of the rear end portion of the back of the arm 17D. As indicated by the blank arrow in FIG.

1B, therefore, the arm 17D of the probe card mounting mechanism 17 can advance in two step from the position on the body 12 toward the probe device, thereby transferring the probe card 21 to a predetermined position in the probe device. This predetermined position can be set in a position right under the clamp mechanism in the probe device.

As the handle 16 is operated in a first step, the left- and right-hand guide rails 17B advance forward from the position on the body 12. In a second step, the motor is driven by switch operation, whereupon the Y-direction ball screw causes the arm 17D to advance forward on the guide rails 17B. The advanced end of the arm 17D can be detected by means of a sensor. The arm 17D is stopped at its advanced end position in response to a detection signal from the sensor. Preferably, the center of the probe card 21 on the arm 17D, in this advanced end position, should be aligned with the center of the clamp mechanism.

The left- and right-hand guide rails 17B can be provided with a lock mechanism for locking them in a retreated end position and advanced end position. The body 12 can be provided with a switch (not shown) for operating the lock mechanism. This switch may be designed so that it can be operated with the handle 16 in a hand. After the lock mechanism is released by switch operation, therefore, the guide rails 17B can be advanced into the probe device 20. The guide rails 17B can be fixed as its advanced end is locked. On the arm 17D, a positioning mechanism may be provided and used for the probe card 21. The probe card 21 is positioned on the arm 17D by means of this positioning member. Further, the probe card mounting mechanism 17 can be provided with a sensor for determining whether or not the probe card 21 exists on the arm 17D.

As shown in FIGS. 1A and 1B, the lift mechanism 18 is fixed left and right on the front face of the body 12 so as to face in the Z-direction. A lift block 18C is caused to engage a pair of guide rails 18A, left and right, by means of engaging members 18B that can ascend and descend in the vertical direction (Z-direction) along the guide rails 18A. In order to drive the motor, a switch can be attached to a region near the handle 16. The engaging members 18B can be fixed above and below on the left- and right-hand sides of the outer surface of the lift block 18C.

Thus, by switching the lift mechanism 18, the arm 17D can be raised or lowered between a lowered end position (down position) and the position (up position) of the clamp mechanism. The down position and the up position can be detected individually by means of sensors (not shown). The arm 17D can be stopped at the down position and the up position in response to detection signals from these sensors. Since the lift between the down position and the up position of the probe device 20 of the same type is constant, the operator can order the lift as software for a control device.

Figure 2:
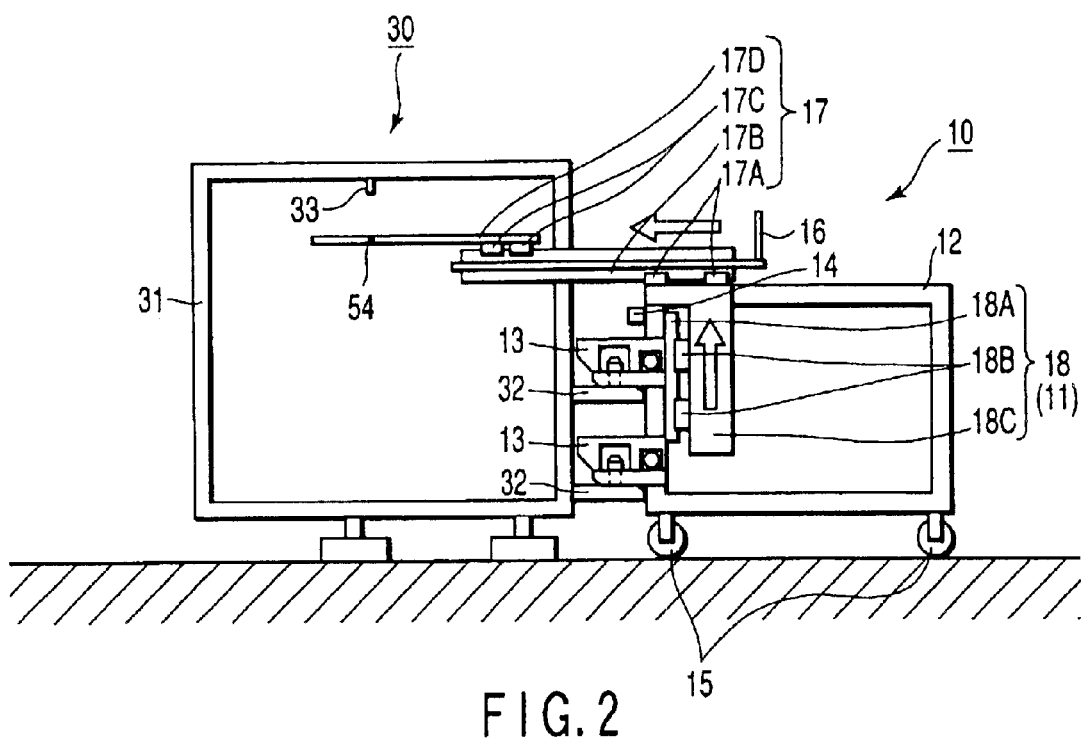
FIG. 2 is a side view showing the way the respective mounting positions of coupling mechanisms of the probe card conveyor shown in FIGS. 1A and 1B are adjusted by means of a master jig.

As shown in FIG. 2, the coupling mechanisms 13 can be attached to the probe card conveyor 10 by the use of a master jig 30. The master jig 30 may comprise a rectangular jig body 31 formed of a frame, four coupled fittings 32, left-hand, right-hand, upper, and lower, fixed to the jig body 31, and a reference pin 33 located in a position corresponding to the center of the clamp mechanism of the probe device 20. The respective positions of the coupled fittings 32 and the reference pin 33 are coincident with the respective positions of the coupled fittings 22 of the probe device 20 and the center position of the clamp mechanism, individually.

Figure 3A:
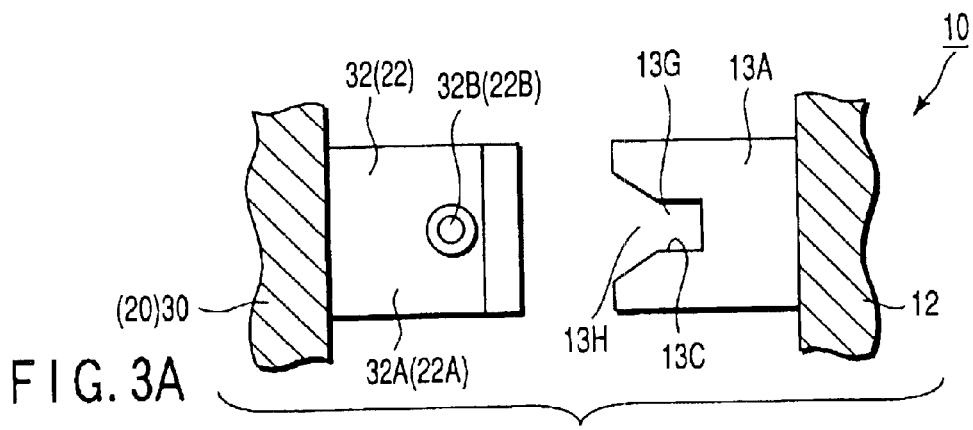
Figure 3B:
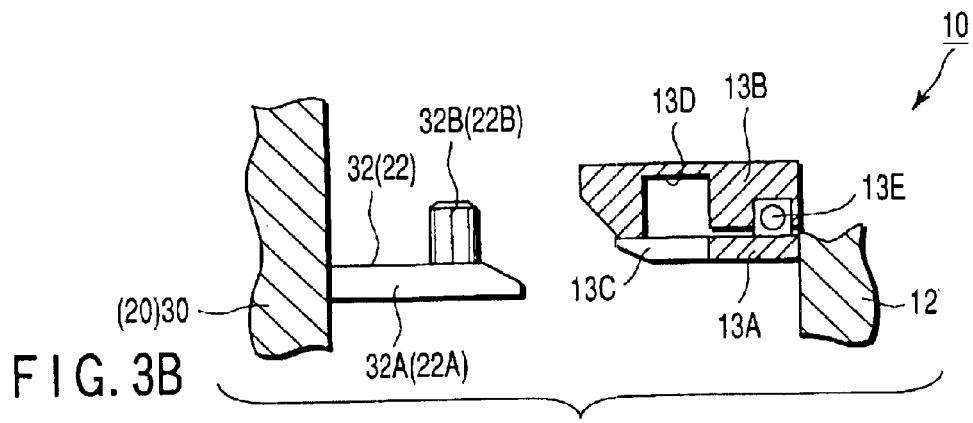

The coupling mechanism 13 is shown in the enlarged views of FIGS. 3A and 3B. The coupling mechanism 13 can include an engaging piece 13A and a coupler 13B, and can be attached to the body 12 for movement for given dimensions in the X-, Y-, and Z-directions, for example, for position adjustment. The coupled fitting 32 can be formed of a horizontal projection 32A that projects horizontally from the jig body 31 and a columnar vertical projection 32B that projects vertically upward from the center of somewhere near the front portion of the horizontal projection 32A with respect to the transverse direction. The horizontal projection 32A can be formed having a rectangular plane shape. Taper surfaces can be formed individually on the distal end of the horizontal projection 32A and the outer periphery of the upper end of the vertical projection 32B. They serve to smooth the coupling with the coupling mechanism 13.

The coupling mechanism 13 will now be described further in detail. The engaging piece 13A of the coupling mechanism 13 is formed of a member that has a rectangular plane shape and projects horizontally from the body 12. A taper surface can be formed on the lower surface of its distal end. A notch portion 13C can be formed in the center of its distal end with respect to the transverse direction. As shown in FIG. 3A, the notch portion 13C can be formed of a rectangular engaging portion 13G that can engage the vertical projection 32B of the coupled fitting 32 and a guide portion 13H that is gradually widened from the engaging portion toward the front end. As shown in FIG. 3B, moreover, the coupler 13B can be formed having a rectangular plane shape and a generous thickness. Its proximal end portion can be supported just over the proximal end portion of the engaging piece 13A by means of a rotating shaft 13E.

Thus, the coupler 13B can rotate around the rotating shaft 13E. A taper surface can be formed on the lower surface of the distal end of the coupler 13B. A hole 13D can be formed in a position a little nearer to the proximal end portion than the lower end of the taper surface. The vertical projection 32B of the coupled fitting 32 can be fitted into the hole 13D. The rotating shaft 13E can be coupled with a pedal, for example. As this pedal is worked, the coupler 13B is rotated clockwise, so that it can be disconnected from the coupled fitting 32.

The following is a description of operation for attaching the coupling mechanism 13 to the body 12 of the probe card conveyor 10. The coupling mechanism 13 is attached in advance to the front face of the body 12 for movement in the X-, Y-, and Z-directions.

Figure 4A:
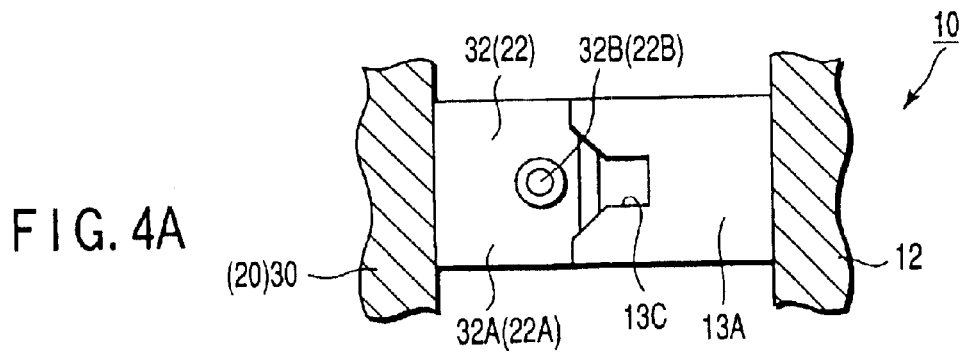
Figure 4B:
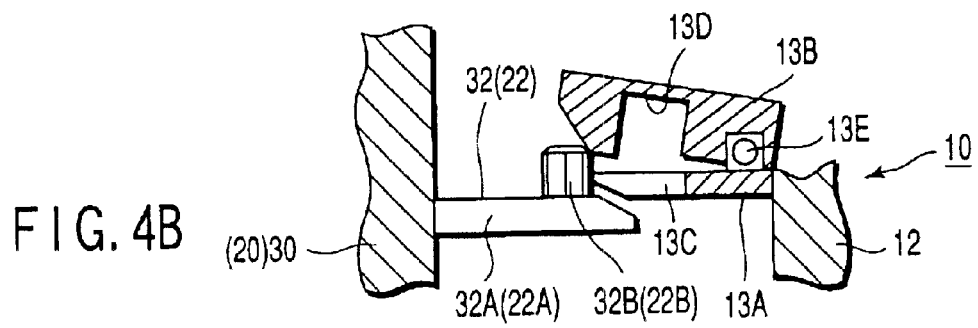
Figure 5A:
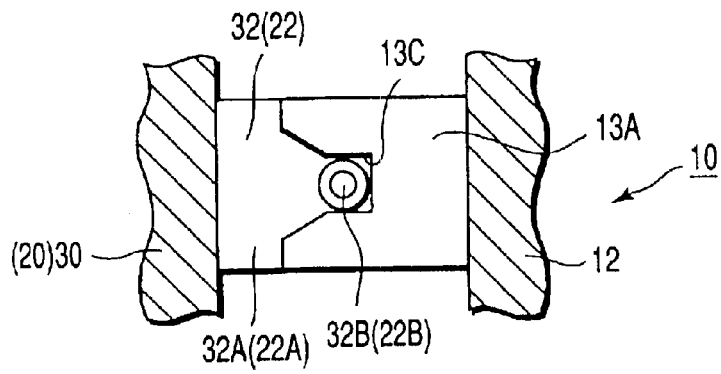
Figure 5B:
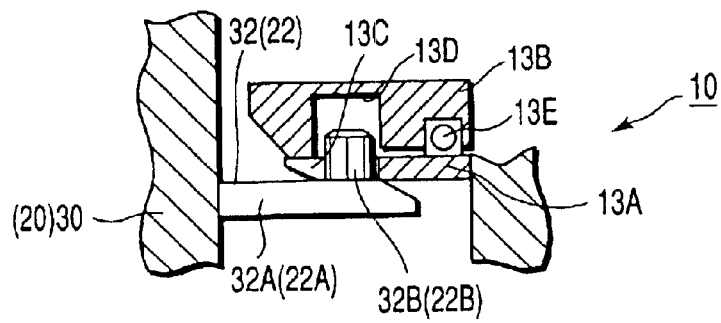
Figure 6A:
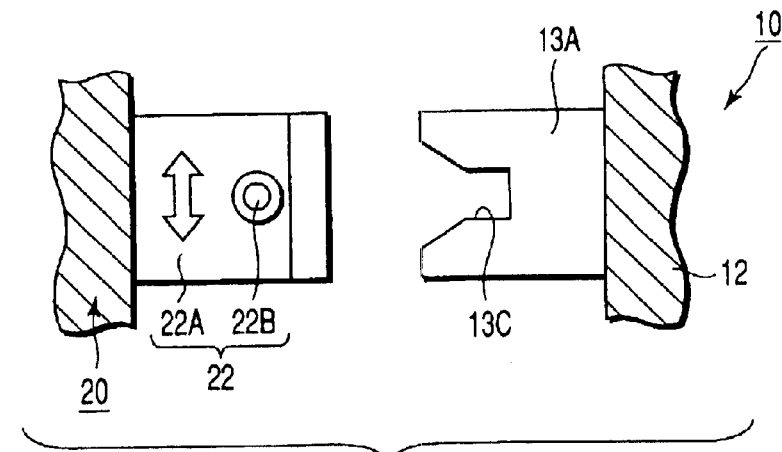
Figure 6B:
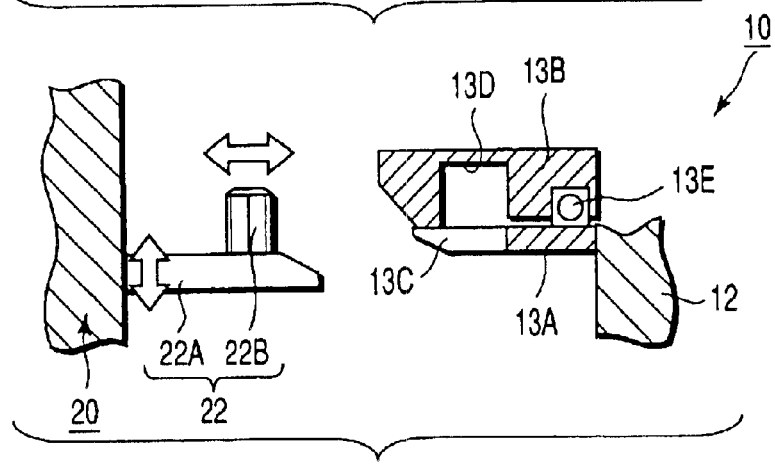

As shown in FIGS. 3A and 3B, the probe card conveyor 10 is pressed against the master jig 30. In this state, the four coupling mechanisms 13 are moved individually in the X-, Y-, and Z-directions, whereupon they are aligned with their corresponding four coupled fittings 32. After the alignment, the probe card conveyor 10 is further pressed against the master jig 30, as shown in FIGS. 4A and 4B. Thereupon, the engaging piece 13A of each coupling mechanism 13 runs on to the horizontal projection 32A of the coupled fitting 32 via the taper surface, while the coupler 13B runs on to the vertical projection 32B. Finally, the vertical projection 32B engages the engaging portion 13C of the engaging piece 13A, and is fitted into the hole 13D of the coupler 13B, whereupon the two elements 13 and 32 are coupled, as shown in FIGS. 5A and 5B.

In consequence, the probe card conveyor 10 is coupled to the master jig 30. Subsequently, the probe card mounting mechanism 17 is advanced into the master jig body 31, and the arm 17D is advanced to an advanced portion. Thereafter, the reference pin 33 is aligned with a reference hole 54 in the upper surface of the arm 17D as the probe card conveyor 10 and the four coupling mechanisms 13 are finely moved in the X- and Y-directions. When the reference pin 33 is allowed smoothly to get into the reference hole of the arm 17D, the coupling mechanisms 13 are fixed to the body 12. This series of operations settles the positions of the coupling mechanisms 13. After the coupling mechanisms 13 are fixed, the coupling mechanisms 13 and the coupled fittings 32 are disconnected from one another by pedal operation. The probe card conveyor 10 is separated from the master jig 30.

After the coupling mechanisms 13 are fixed to the probe card conveyor 10, the coupled fittings 22 are attached individually to four spots on the front face of the undelivered probe device 20 for movement in the X-, Y-, and Z-directions. The probe card conveyor 10 is brought close to the probe device 20. As the coupled fittings 22 are finely moved, as indicated by arrows in FIGS. 6A and 6B, the coupled fittings 22 are aligned individually with the coupling mechanisms 13 of the probe card conveyor 10.

As the probe card conveyor 10 is then pressed against the probe device 20, each coupling mechanism 13 is coupled to its corresponding coupled fitting 22. Thereafter, the position of the probe card mounting mechanism 17 is adjusted so that the reference pin of the probe card clamp mechanism gets into the reference hole of the probe card 21, for example. After this alignment is finished, each coupled fitting 22 of the probe device 20 is fixed. If the probe card 21 is loaded into or unloaded from the probe device 20 in the place of delivery of the probe device 20, the probe card 21 can be easily loaded or unloaded with use of the probe card conveyor 10. Preferably, the coupled fittings 22 of the probe device 20 should be formed after the coupled fittings 32 of the master jig 30.

A method for loading the probe card 21 into the probe device 20 with use of the probe card conveyor 20 will now be described with reference to FIGS. 1A and 1B and FIGS. 3A to 5B.

(1) First, the operator selects the probe card 21 to be used by touching an operation panel 24 of the probe device 20.

(2) As a result of this operation, a main chuck 25 in the probe device 20 moves from under the clamp mechanism shown in FIG. 1A to the position shown in FIG. 1B.

(3) Steps of procedure for loading the probe card 21 and a confirmation button are displayed on the operation panel 24.

(4) The operator takes out the probe card 21 to be used from the storage section and sets it on the arm 17D of the probe card conveyor 10.

(5) As shown in FIG. 1A, the probe card conveyor 10, carrying the probe card 21 thereon, is moved to the probe device 20.

(6) The probe card 21 is loaded into the probe device in accordance with steps of procedure displayed on the operation panel 24. The operator opens a front door of the probe device 20. The operator pushes the handle 16, thereby bringing the probe card conveyor 10 close to the probe device 20. As this is done, the coupling mechanisms 13 of the probe card conveyor 10 are aligned individually with the coupled fittings 22 of the probe device 20, as shown in FIGS. 1A and 1B and FIGS. 3A and 3B.

(7) The operator further presses the probe card conveyor 10 against the probe device 20. The engaging piece 13A of the coupling mechanism 13 runs on to a horizontal projection 22A of the coupled fitting 22, and the coupler 13B of the coupling mechanism 13 runs on to a vertical projection 22B.

(8) As the operator pushes the probe card conveyor 10 toward the probe device 20, the engaging piece 13A and the vertical projection 22B engage each other, and the vertical projection 22B is fitted into the hole 13D of the coupler 13B, as shown in FIG. 1B and FIGS. 5A and 5B. In consequence, the coupling mechanism 13 is coupled to the coupled fitting 22. In this series of operations, the probe card conveyor 10 is coupled to the probe device 20.

(9) The operator operates the probe card conveyor 10. As the operator operates the switch, the guide rails 17B of the probe card mounting mechanism 17 are unlocked. The operator causes the pair of guide rails 17B to advance into the probe device 20 by pushing the handle 16. The guide rails 17B are fixed at the advanced end.

(10) As the motor and the ball screw are driven, the arm 17D is advanced along the pair of guide rails 17B to the advanced end position (see FIG. 1B). The sensor detects the arrival of the arm 17D at the advanced end position, whereupon the advance of the arm 17D is stopped.

(11) As the motor and the ball screw of the lift mechanism 18 are driven, the arm 17D is raised from its down position by means of the lift block 18C. The sensor detects this up position, and the arm 17D is stopped at the up position.

(12) As the confirmation button of the operation panel 24 is then touched, the sensor in the probe device 20 detects the probe card 21 in the up position. In response to the resulting detection signal, the clamp mechanism is driven, whereupon the clamp mechanism holds and fixes the probe card 21.

(13) The operation panel 24 displays the confirmation button and steps of procedure starting with separation of the probe card from the probe card conveyor 10 and ending with closure of the door of the probe device 20.

(14) The lift mechanism 18 lowers the arm 17D by means of infrared communication between the probe device 20 and the probe card conveyor 10. The lift mechanism 18 is stopped when the sensor detects that the down position is reached by the arm 17D.

(15) The arm 17D is driven to retreat onto the pair of guide rails 17B by means of the motor and the ball screw.

(16) The operator draws out the pair of guide rails 17B from the probe device 20. As the operator operates the pedal, the coupling mechanisms 13 and the coupled fittings 22 are disconnected from one another. The probe card conveyor 10 is separated from the probe device 20, and the door of the probe device 20 is closed.

(17) When the confirmation button of the operation panel 24 is touched, loading the probe card 21 is finished.

The following is a description of operation for replacing the probe card 21 held in the clamp mechanism of the probe device with another probe card 21.

(18) The operator selects probe card replacement from the display on the operation panel 24.

(19) The main chuck 25 retreats from the position shown in FIG. 1A to the position shown in FIG. 1B.

(20) The operation panel 24 displays the confirmation button and procedural steps for raising the arm 17D to the up position in the probe device 20.

(21) The probe card conveyor 10 having no probe card therein is coupled to the probe device 20 in the aforementioned manner.

(22) An instruction for replacement of the probe card 21 is given from the probe card conveyor 10 to the probe device 20 through infrared communication.

(23) The operator causes the arm 17D of the probe card mounting mechanism 17 to advance to the advanced end position in the probe device 20.

(24) The arm 17D is raised from the down position to the up position by means of the lift mechanism 18.

(25) The probe card 21 is released from the clamp mechanism as the confirmation button is touched.

(26) The probe card 21 from the clamp mechanism is placed on the arm 17D of the probe card mounting mechanism 17. The sensor determines whether or not the probe card 21 is on the arm 17D of the probe card is conveyor 10.

(27) After the probe card 21 is recognized, the operation panel 24 displays the confirmation button and steps of procedure for placing the new probe card 21 on the arm 17D and raising the arm 17D to the up position.

(28) The arm 17D is lowered from the up position to the down position in the aforementioned manner. The arm 17D retreats from the probe device 20 to the outside of the probe device 20.

(29) The probe card conveyor 10 moves to the storage section. Thereupon, the probe card 21 on the arm 17D is replaced with a new probe card.

(30) The probe card conveyor 10 conveys the new probe card 21 to the probe device 20.

(31) Thereafter, a series of replacing operations are carried out according to the aforesaid steps (1) to (17).

A detailed construction of the probe card conveyor 10 will be described with reference to FIGS. 7 to 10B.

Figure 7:
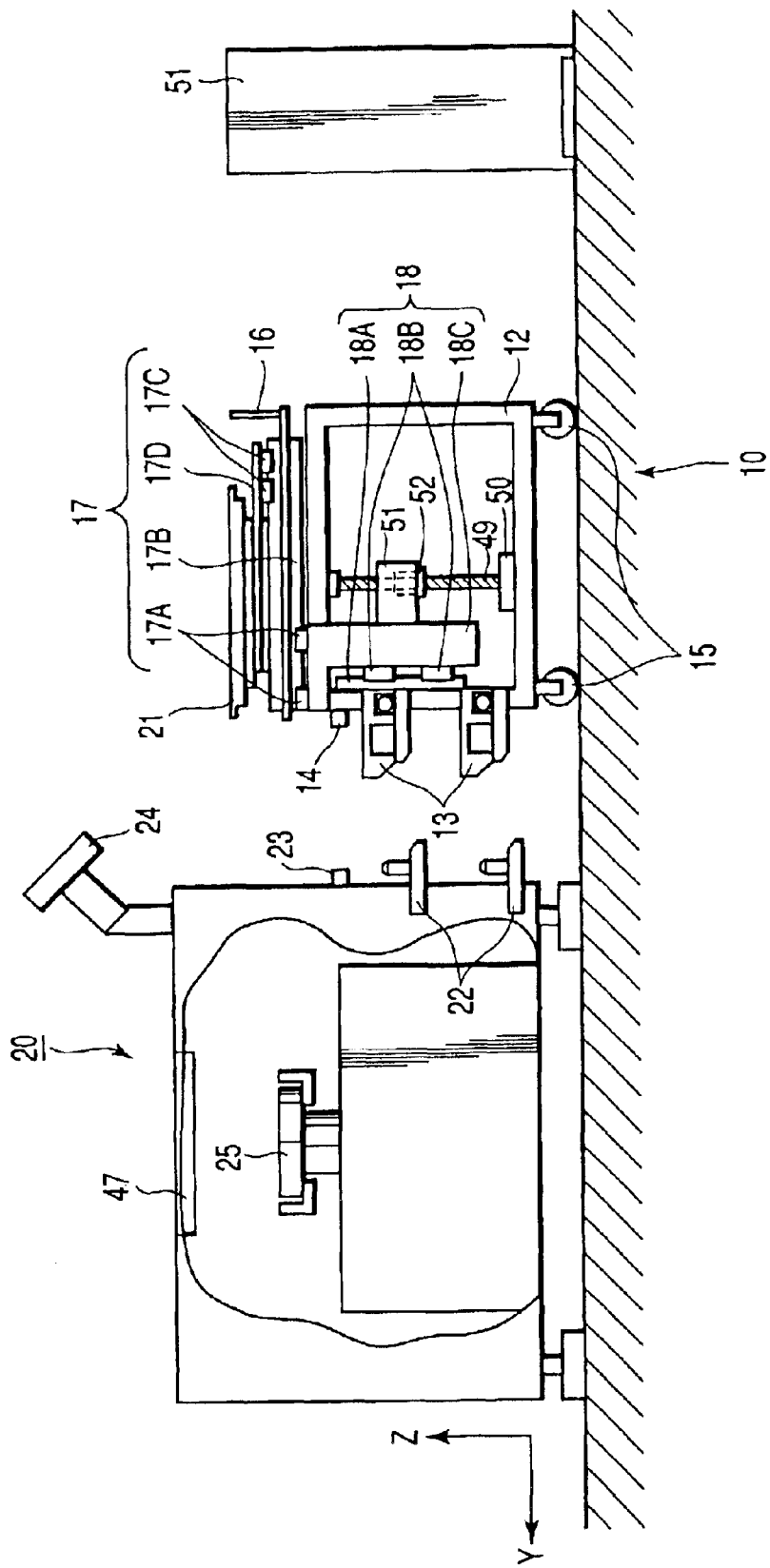
FIG. 7 is a view showing the one embodiment of the probe card conveyor of the present invention further in detail, illustrating an operating state immediately before the probe card conveyor and the probe device are coupled to each other.
Figure 9:
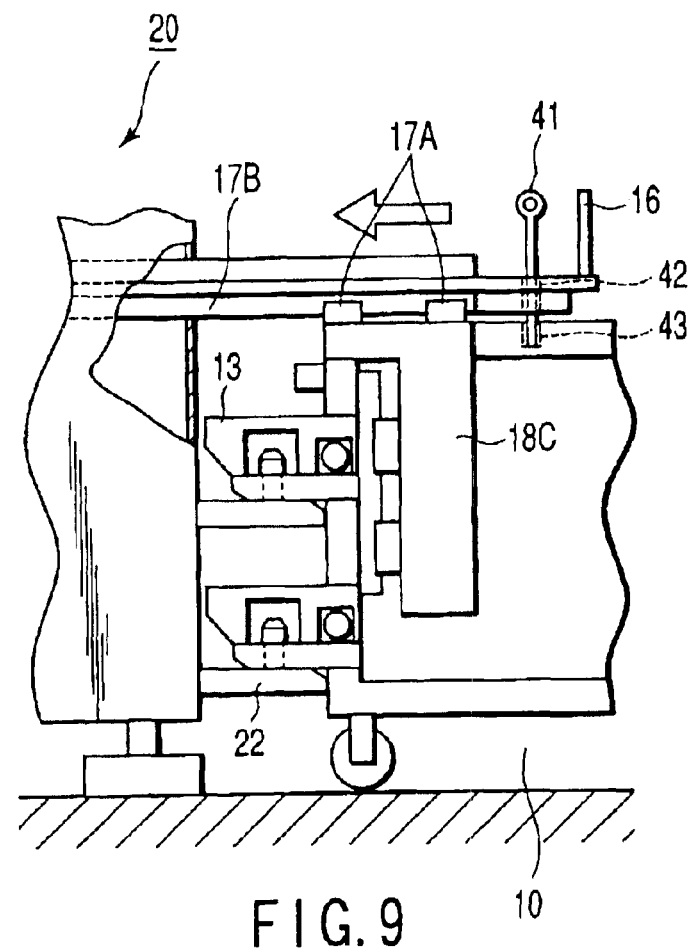
FIG. 9 is a side view showing further in detail a lock mechanism of the probe card conveyor shown in FIGS. 1A and 1B.

As shown in FIG. 7, the probe card mounting mechanism 17 may be provided with the left- and right-hand guide members 17A, the pair of guide rails 17B, left and right, in engagement for Y-direction movement along the guide members 17A, the arm 17D in engagement for movement in the Y-direction by the engaging members 17C along the left- and right-hand guide rails 17B, a Y-direction ball screw 49 coupled to the arm 17D by means of the a nut member 52, a motor 50 for driving the Y-direction ball screw, and the switch (not shown) for operating the motor. The engaging members 17C can be fixed in front and in rear on the left- and right-hand sides of the rear end portion of the reverse of the arm 17D.

As indicated by the blank arrows in FIG. 8, therefore, the arm 17D of the probe card mounting mechanism 17 can advance in two step from the position on the body 12 toward the probe device, thereby transferring the probe card 21 to the predetermined position in the probe device. This predetermined position can be set in a position right under the clamp mechanism in the probe device.

As the handle 16 is operated in the first step, the left- and right-hand guide rails 17B advance forward from the position on the body 12. In the second step, the motor is driven by switch operation, whereupon the Y-direction ball screw causes the arm 17D to advance forward on the guide rails 17B. The advanced end of the arm 17D can be detected by means of a sensor 59. The arm 17D is stopped at its advanced end position in response to a detection signal from the sensor. Preferably, the center of the probe card 21 on the arm 17D, in this advanced end position, should be aligned with the center of the clamp mechanism 47 (see FIG. 8).

The left- and right-hand guide rails 17B can be provided with the lock mechanism for locking them in the retreated end position and the advanced end position. The lock mechanism can be a pin that is inserted into a recess 43 through an opening 42 by means of electromagnetic force (see FIG. 9).

The body 12 can be provided with a switch (not shown) for operating the lock mechanism. This switch may be designed so that it can be operated while holding the handle 16. After the lock mechanism is released by switch operation, therefore, the guide rails 17B can be advanced into the probe device 20. The guide rails 17B can be fixed as its advanced end is locked. On the arm 17D, the positioning mechanism may be provided and used for the probe card 21.

As shown in FIG. 8, this mechanism may be a mechanism that engages the recess 45 in the probe card 21 with the projection 46 on the arm 17D. This mechanism enables the probe card 21 to be placed securely in the predetermined position on the arm 17D. Further, the probe card mounting mechanism 17 can be provided with a sensor 48 (see FIG. 8) for determining whether or not the probe card 21 exists on the arm 17D.

As shown in FIG. 7, the lift mechanism 18 can be composed of the pair of guide rails 18A, the engaging members 18B that can ascend and descend, the lift block 18C, the nut member 52, a Z-direction ball screw 49, and the motor 50.

The pair of guide rails 18A are fixed left and right on the front face of the body 12 so as to face in the Z-direction. The lift block 18C is caused to engage the pair of guide rails 18A, left and right, by means of the engaging members 18B that can ascend and descend in the vertical direction (Z-direction) along the guide rails 18A.

As the Z-direction ball screw 49 is rotated by means of the motor 50, it raises or lowers a projection 51 of the lift block 18C by means of the nut member 52. In order to drive this motor, the switch can be attached to the region near the handle 16. The engaging members 18B can be fixed above and below on the left- and right-hand sides of the outer surface of the lift block 18C. Thus, by switching the lift mechanism 18, the arm 17D can be raised or lowered between the lowered end position (down position) and the position (up position) of the clamp mechanism. The down position and the up position can be detected individually by means of sensors (not shown). The arm 17D can be stopped at the down position and the up position in response to detection signals from these sensors. Since the lift between the down position and the up position of the probe device 20 of the same type is constant, the operator can order the lift as software for a control device.

As shown in FIG. 2, the coupling mechanisms 13 can be attached to the probe card conveyor 10 by the use of the master jig 30.

Figure 10A:
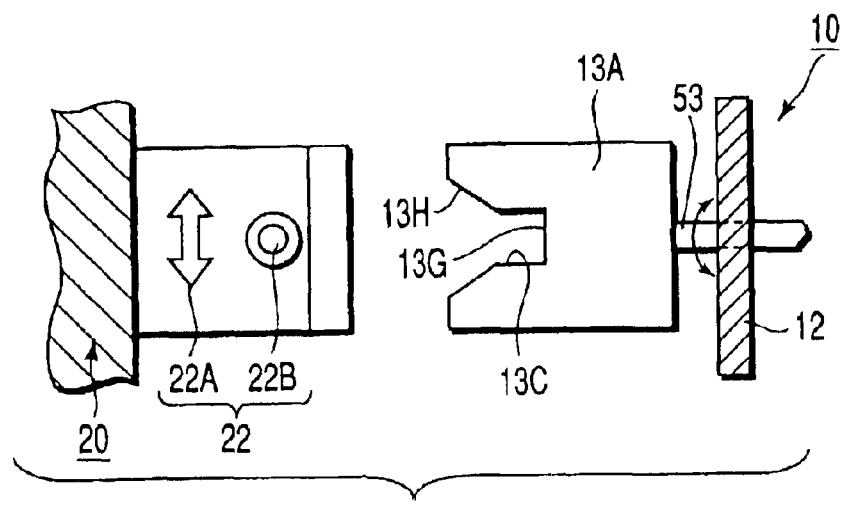
Figure 10B:
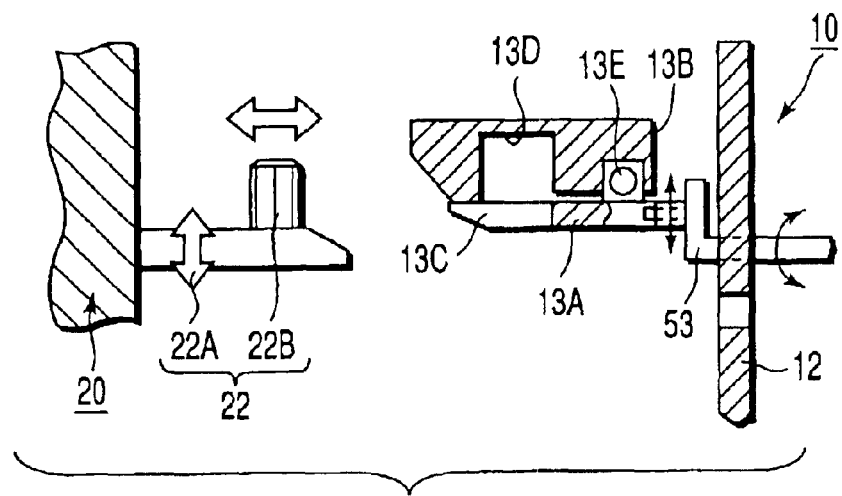
Figure 11:
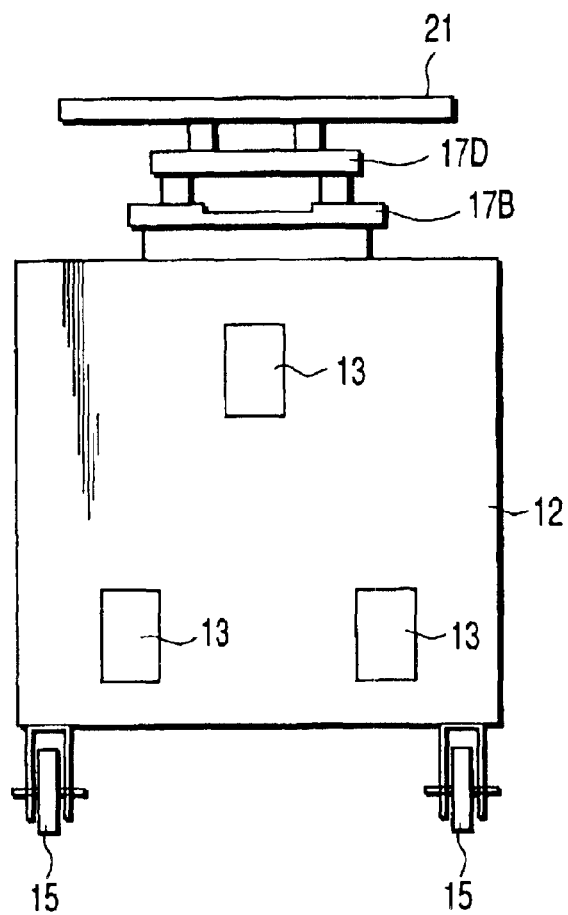
FIG. 11 is a side view a mounting layout for the coupling mechanisms of the probe card conveyor shown in FIGS. 1A and 1B.

The coupling mechanism 13 is shown in the enlarged views of FIGS. 10A and 10B. The coupling mechanism 13 can include the engaging piece 13A and the coupler 13B, and can be attached to the body 12 for movement for given dimensions in the X-, Y-, and Z-directions, for example, for position adjustment. The coupled fitting 22 can be formed of the horizontal projection 22A that projects horizontally from the probe device 20 and the columnar vertical projection 22B that projects vertically upward from the center of somewhere near the front portion of the horizontal projection 22A with respect to the transverse direction. The horizontal projection 22A can be formed having a rectangular plane shape. Taper surfaces can be formed individually on the distal end of the horizontal projection 22A and the outer periphery of the upper end of the vertical projection 22B. They serve to smooth the coupling with the coupling mechanism 13.

The coupling mechanism 13 will now be described further in detail. The engaging piece 13A of the coupling mechanism 13 is formed of a member that has a rectangular plane shape and projects horizontally from the body 12. A taper surface can be formed on the lower surface of its distal end. The notch portion 13C can be formed in the center of its distal end with respect to the transverse direction. As shown in FIG. 10A, the notch portion 13C can be formed of the rectangular engaging portion 13G that can engage the vertical projection 22B of the coupled fitting 22 and the guide portion 13H that is gradually widened from the engaging portion toward the front end. As shown in FIG. 10B, moreover, the coupler 13B can be formed having a rectangular plane shape and a generous thickness. Its proximal end portion can be supported just over the proximal end portion of the engaging piece 13A by means of the rotating shaft 13E. Thus, the coupler 13B can rotate around the rotating shaft 13E. A taper surface can be formed on the lower surface of the distal end of the coupler 13B. The hole 13D can be formed in a position a little nearer to the proximal end portion than the lower end of the taper surface. The vertical projection 22B of the coupled fitting 22 can be fitted into the hole 13D. The rotating shaft 13E can be coupled with a pedal 44 (FIG. 8), for example. As this pedal is worked, the coupler 13B is rotated clockwise, so that it can be disconnected from the coupled fitting 32.

The following is a description of the operation for attaching the coupling mechanism 13 to the body 12 of the probe card conveyor 10. The coupling mechanism 13 is attached in advance to the front face of the body 12 for movement in the X-, Y-, and Z-directions. FIGS. 10A and 10B show an example of a mechanism for this operation. An L-shaped shaft 53 is rotatably attached to the body 12 of the probe card conveyor 10. The engaging piece 13A is attached to an arm portion of the shaft 53 for up-and-down motion. As a result of the rotation of the shaft 53 and the up-and-down motion of the engaging piece 13A, the coupling mechanism 13 can be attached to the front face of the body 12 for movement in the X-, Y-, and Z-directions.

According to the present embodiment, as described above, the probe card conveyor 10 comprises the body 12, the probe card mounting mechanism 17, and the coupling mechanisms 13 in a plurality of positions on that side face of the body which is opposed to the probe device 20. The probe card conveyor 10 includes the probe card mounting mechanism 17 for transferring the probe card 21 in the Y-direction and the lift mechanism 18 for raising and lowering the probe card mounting mechanism 17. After the coupling mechanisms 13 of the probe card conveyor 10 are coupled individually to the coupled fittings 22 of the probe device 20, the probe card mounting mechanism 17 of the probe card conveyor 10 is advanced to the down position in the probe device 20.

Further, the arm 17D of the probe card mounting mechanism 17 is raised from the down position to the up position by means of the lift mechanism 18 of the probe card conveyor 10. In this position, the probe card is delivered from or to the clamp mechanism. The arm 17D of the probe card mounting mechanism 17 is lowered from the up position to the down position by means of the lift mechanism 18 of the probe card conveyor 10. After the probe card mounting mechanism 17 of the probe card conveyor 10 is retreated from the probe device 20, the coupling mechanisms 13 and the coupled fittings 22 are disconnected from one another. In this manner, the operator can semiautomatically replace the probe card 21 that is large-sized and weighty. The large-sized, weighty probe card 21 can be conveyed safely and easily to the target probe device 20 by means of the probe card conveyor 10 without burdening the operator. Since the probe card conveyor 10 is common to a plurality of probe devices 20, a probe card conveyor mechanism that is attached to each of conventional probe devices 20 can be omitted. In consequence, the footprint in a clean room can be lessened, and therefore, the cost of the probe device 20 itself can be lowered.

According to the present embodiment, the coupling mechanism 13 can include the engaging piece 13A that engages the coupled fitting 22 of the probe device 20 and the coupler 13B that is coupled to the coupled fitting 22. When the probe card 21 is loaded or unloaded, therefore, the probe card conveyor 10 can be coupled to the probe device 20 in a constant positional relation, so that the probe card 21 can be replaced securely. The body 12 can be provided with a pedal for disconnecting the coupler 13B and the coupled fitting 22. The probe card conveyor 10 can be easily disengaged from the probe device 20 by only operating this pedal. The body can be provided with a sensor for determining the presence of the probe card 21. This sensor can securely prevent mistakes in the operation for loading or unloading the probe card 21.

The present invention is not limited to the embodiment described above. If necessary, for example, the probe card conveyor 10 that is semiautomatic may be further automated or made manual. For example, conventional optical sensors may be used as the sensors that are attached to the probe card conveyor 10 of the foregoing embodiment.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A probe card conveyor configured to convey a probe card to a probe device, comprising:

a body configured to move with respect to the probe device;

a plurality of coupling mechanisms provided on a side face of the body opposed to the probe device, the coupling mechanisms configured to be coupled individually to coupled fittings on the probe device;

a probe card mounting mechanism attached to the body, the probe card mounting mechanism configured to move in a horizontal direction with the probe card mounted thereon; and a lift mechanism attached to the body and configured to raise and lower the probe card mounting mechanism, wherein the probe card mounting mechanism comprises an arm configured to carry the probe card thereon and to transfer the probe card from the body to a main chuck located in the probe device.

2. A probe card conveyor configured to convey a probe card to a probe device, comprising:

a body configured to move with respect to the probe device;

a plurality of coupling mechanisms provided on a side face of the body opposed to the probe device, the coupling mechanisms configured to be coupled individually to coupled fittings on the probe device;

a probe card mounting mechanism attached to the body, the probe card mounting mechanism configured to move in a horizontal direction with the probe card mounted thereon; and a lift mechanism attached to the body and configured to raise and lower the probe card mounting mechanism, wherein the lift mechanism comprises a Z-direction ball screw and a motor configured to rotate the ball screw.

3. A probe card conveyor configured to convey a probe card to a probe device, comprising:

a body configured to move with respect to the probe device;

a plurality of coupling mechanisms provided on a side face of the body opposed to the probe device, the coupling mechanisms configured to be coupled individually to coupled fittings on the probe device;

a probe card mounting mechanism attached to the body, the probe card mounting mechanism configured to move in a horizontal direction with the probe card mounted thereon; and a lift mechanism attached to the body and configured to raise and lower the probe card mounting mechanism.

4. The probe card conveyor according to claim 1, wherein the coupling mechanism comprises an engaging piece configured to engage the coupled fitting to be aligned with the coupled fitting and a coupler configured to be coupled to the coupled fitting.

5. The probe card conveyor according to claim 1, further comprising:

a master jig configured to adjust respective positions of the coupling mechanisms.

6. The probe card conveyor according to claim 4, wherein the coupling mechanisms are located in at least three positions on the side face of the body.

7. The probe card conveyor according to claim 4, further comprising:

a movable structure connecting the coupling mechanisms to the side face of the body.

8. The probe card conveyor according to claim 4, wherein the body comprises means for disconnecting the coupler and the coupled fitting.

9. The probe card conveyor according to claim 1, further comprising:

a sensor configured to determine whether the probe card is placed on the probe card mounting mechanism.

10. A probe card conveying method comprising:

coupling a probe card conveyor comprising a probe card mounting mechanism to a probe device;

inserting the probe card mounting mechanism into a predetermined position in the probe device;

raising the probe card mounting mechanism toward a clamp mechanism disposed in an upper part of the probe device;

attaching and detaching the probe card between the clamp mechanism and the probe card mounting mechanism;

lowering the probe card mounting mechanism to the predetermined position;

returning the probe card mounting mechanism to the probe card conveyor; and disconnecting the probe card conveyor and the probe device from each other.

11. The probe card conveying method according to claim 10, further comprising:

adjusting respective positions of coupling mechanisms set on the probe card conveyor by a master jig before the probe card conveyor is coupled to the probe device.

12. A probe card conveyor configured to convey a probe card to a probe device, comprising:

a body configured to move with respect to the probe device;

a probe card mounting mechanism attached to the body, the probe card mounting mechanism configured to move in a horizontal direction with the probe card mounted thereon; and a lift mechanism attached to the body and configured to raise and lower the probe card mounting mechanism.

* * * * *

UNITED STATES PATENT AND TRADEMARK OFFICE
CERTIFICATE OF CORRECTION

PATENT NO. : 6,838,892 B2
DATED : January 4, 2005
INVENTOR(S) : Masaru Suzuki

It is certified that error appears in the above-identified patent and that said Letters Patent is hereby corrected as shown below:

<u>Title page,</u>
Item [54], Title, should read as follows:
-- PROBE CARD CONVEYOR AND PROBE CARD CONVEYING METHOD --.

Signed and Sealed this

Twenty-third Day of August, 2005

JON W. DUDAS
*Director of the United States Patent and Trademark Office*